United States Patent
Sheng et al.

(10) Patent No.: US 9,793,208 B2
(45) Date of Patent: Oct. 17, 2017

(54) PLASMA DISCHARGE PATH

(71) Applicant: GLOBALFOUNDRIES Singapore Pte. Ltd., Singapore (SG)

(72) Inventors: Haifeng Sheng, Singapore (SG); Juan Boon Tan, Singapore (SG); Wanbing Yi, Singapore (SG); Daxiang Wang, Singapore (SG); Soh Yun Siah, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/869,963

(22) Filed: Sep. 29, 2015

(65) Prior Publication Data

US 2017/0092584 A1  Mar. 30, 2017

(51) Int. Cl.

| H01L 23/525 | (2006.01) |
|---|---|
| H01L 21/02 | (2006.01) |
| H01L 21/3065 | (2006.01) |
| H01L 23/62 | (2006.01) |
| H01L 21/3213 | (2006.01) |
| H01L 27/07 | (2006.01) |
| H01L 21/768 | (2006.01) |
| H01L 21/8238 | (2006.01) |
| H01L 27/02 | (2006.01) |

(52) U.S. Cl.
CPC .... *H01L 23/5256* (2013.01); *H01L 21/32136* (2013.01); *H01L 21/76802* (2013.01); *H01L 21/823892* (2013.01); *H01L 23/62* (2013.01); *H01L 27/0255* (2013.01); *H01L 27/0727* (2013.01)

(58) Field of Classification Search
CPC ..................... H01L 23/5256; H01L 21/32136
See application file for complete search history.

(56) References Cited

U.S. PATENT DOCUMENTS

| 6,323,076 | B1 * | 11/2001 | Wilford | ............ H01L 21/28123 |
| | | | | 257/E21.206 |
| 6,365,938 | B2 * | 4/2002 | Lee | ...................... H01L 27/0255 |
| | | | | 257/355 |
| 6,433,403 | B1 * | 8/2002 | Wilford | ............ H01L 21/28123 |
| | | | | 257/355 |
| 6,664,140 | B2 * | 12/2003 | Lee | ...................... H01L 27/0255 |
| | | | | 438/128 |
| 7,018,935 | B2 * | 3/2006 | Park | ........................ H01L 23/62 |
| | | | | 257/E21.311 |
| 7,106,164 | B2 * | 9/2006 | Voldman | .............. H01H 85/046 |
| | | | | 257/E23.149 |
| 7,683,452 | B2 * | 3/2010 | Ohkawa | ............ H01L 27/14603 |
| | | | | 257/459 |
| 7,821,100 | B2 * | 10/2010 | Higuchi | .............. H01L 23/5256 |
| | | | | 257/209 |
| 7,888,769 | B2 * | 2/2011 | Kondo | ..................... H01L 23/62 |
| | | | | 257/209 |

(Continued)

*Primary Examiner* — Victor A Mandala
*Assistant Examiner* — Regan J Rundio
(74) *Attorney, Agent, or Firm* — Horizon IP Pte. Ltd.

(57) ABSTRACT

A semiconductor device with a temporary discharge path. During back-end-of-line (BEOL), the temporary discharge path discharges a plasma charge collected in a device well, such as a floating p-type well. After processing, the temporary discharge path is rendered non-function, enabling the device to function properly.

20 Claims, 4 Drawing Sheets

(56) References Cited

U.S. PATENT DOCUMENTS

| | | | |
|---|---|---|---|
| 7,948,035 B2* | 5/2011 | Yang | H01L 27/11565 257/324 |
| 8,188,574 B2* | 5/2012 | Angyal | H01L 23/562 257/347 |
| 8,546,855 B2* | 10/2013 | Zhou | H01L 21/84 257/288 |
| 8,890,164 B1* | 11/2014 | Pan | H01L 21/823493 257/69 |
| 2009/0206386 A1* | 8/2009 | Yang | H01L 27/11565 257/324 |
| 2014/0264505 A1* | 9/2014 | Chiu | H01L 22/14 257/292 |
| 2015/0001592 A1* | 1/2015 | Lai | H01L 23/5256 257/288 |

* cited by examiner

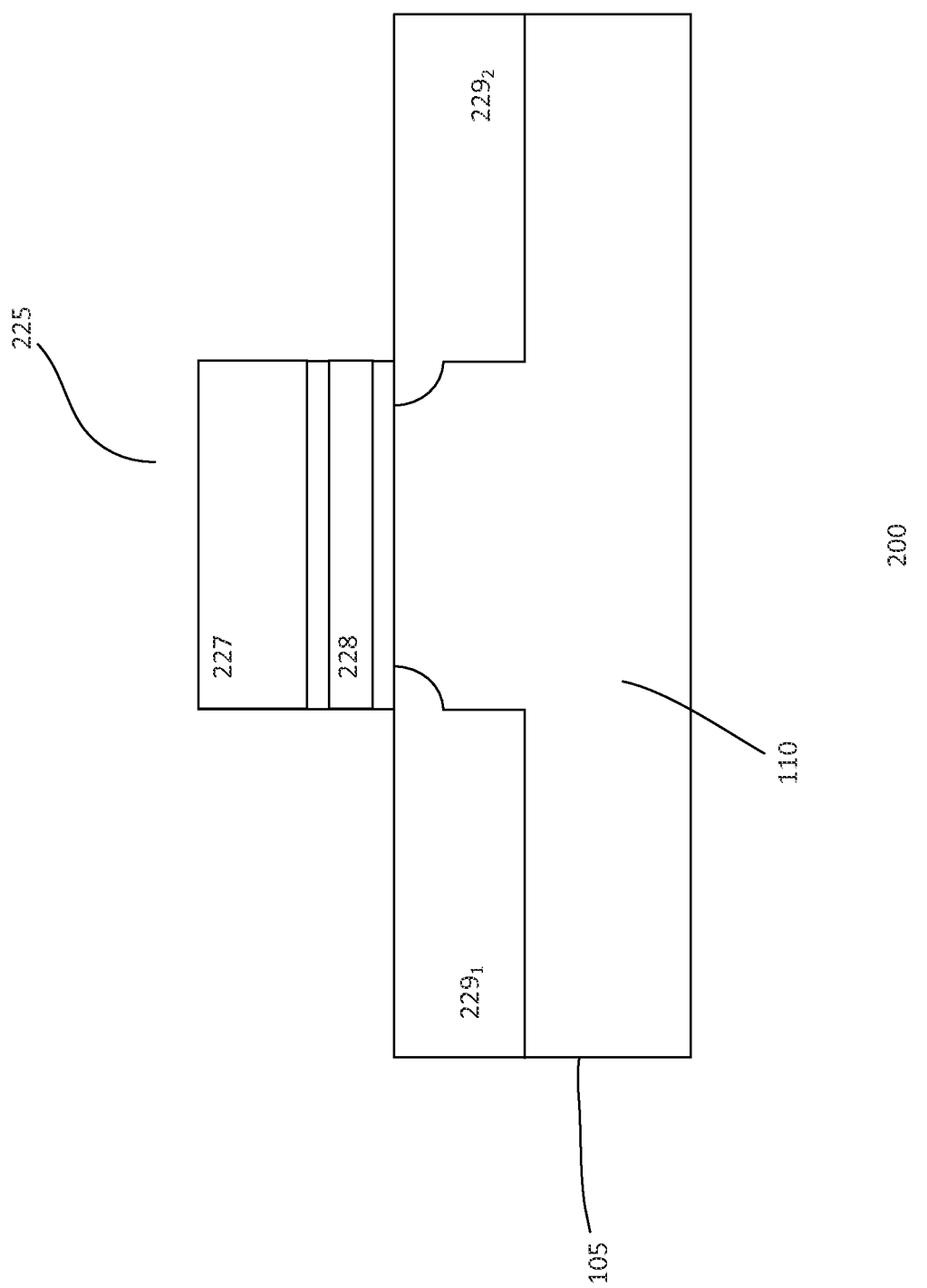

PLASMA DISCHARGE PATH

BACKGROUND

In a semiconductor device fabrication, back-end-of-line (BEOL) wafer processing generally involves forming inter-level dielectric (ILD) layers which include interconnects and via contacts. The interconnects and via contacts in the (ILD) layers interconnect the various components of the device as desired. Reactive ion etch (RIE) is employed to form trenches and vias to form the interconnects and via contacts.

However, plasma charges from the RIE collect in floating wells in the substrate of the device. The BEOL processing includes a clean process using a diluted hydrofluoric acid (DHF) solvent. For example, a DHF solvent is used to clean post etch residues. The DHF solvent along with the plasma charges collected in the floating well cause copper ion ($Cu^{2+}$) migration, resulting in voids in the interconnects. For example, voids may form in an interconnect causing an open or high resistance connection with a via contact above.

From the foregoing discussion, there is a need to discharge plasma charges collected in floating wells of a device to improve reliability.

SUMMARY

Embodiments of the present disclosure generally relate to semiconductor devices and methods for forming a device.

In one embodiment, a device is disclosed. The device includes a semiconductor substrate, a device region in the substrate with a second polarity type floating well, a first polarity type device disposed in the device region, a discharge region in the substrate with first polarity type dopants and a discharger with a temporary discharge path from the device region to the discharge region. The temporary discharge path is functional during back-end-of-line (BEOL) processing to discharge plasma charge from the floating well to the discharge region of the substrate. After the BEOL processing is completed, the temporary discharge path is non-functional to enable the first polarity type device to function.

In another embodiment, a method of forming a device is disclosed. The method includes providing a semiconductor substrate, forming a second polarity type floating well in a device region in the substrate, forming a first polarity type doped region in a discharge region of the substrate outside of the floating well which serves as a first diode terminal, forming a second polarity type doped region in the floating well which serves as a second diode terminal, completing front-end-of-line (FEOL) processing including forming first polarity type devices in the device region and commencing back-end-of-line (BEOL) processing including forming a plurality of interlevel dielectric (ILD) levels on the substrate. An ILD level includes a via level with via contacts disposed below a metal level with metal interconnects. The method also includes forming a fuse unit in a fuse metal level which is one of the metal levels of the plurality of ILD levels where the fuse unit includes a first fuse terminal connected to the first diode terminal, a second fuse terminal connected to the second diode terminal, at least one fuse connecting the first and second fuse terminals and the fuse unit and diode forming a discharger with a temporary discharge path from the device region to the discharge region. The temporary discharge path is functional during the BEOL processing to discharge plasma charge from the floating well to the discharge region of the substrate. After the BEOL processing is completed, the temporary discharge path is non-functional to enable the first polarity type device to function.

In another embodiment, a device is disclosed. The device includes a semiconductor substrate, a device region in the substrate with a p-type floating well, a n-type device disposed in the device region, a discharge region in the substrate with n-type dopants and a discharger with a temporary discharge path from the device region to the discharge region. The temporary discharge path is functional during back-end-of-line (BEOL) processing to discharge plasma charge from the floating well to the discharge region of the substrate. After the BEOL processing is completed, the temporary discharge path is non-functional to enable the n-type device to function.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

The accompanying drawings, which are incorporated in and form part of the specification in which like numerals designate like parts, illustrate preferred embodiments of the present disclosure and, together with the description, serve to explain the principles of various embodiments of the present disclosure.

FIG. 2 shows a cross-sectional view of a non-volatile memory cell; and

DETAILED DESCRIPTION

Embodiments of the present disclosure generally relate to semiconductor devices. Embodiments generally relate to devices, such as semiconductor devices or integrated circuits (ICs). Other suitable types of devices may also be useful. The devices can be any type of IC, for example, dynamic or static random access memories, signal processors, or system-on-chip (SoC) devices. The devices can be incorporated into, for example, consumer electronic products, such as computers, cell phones, and personal digital assistants (PDAs). Incorporating the devices in other applications may also be useful.

Figure 1A:
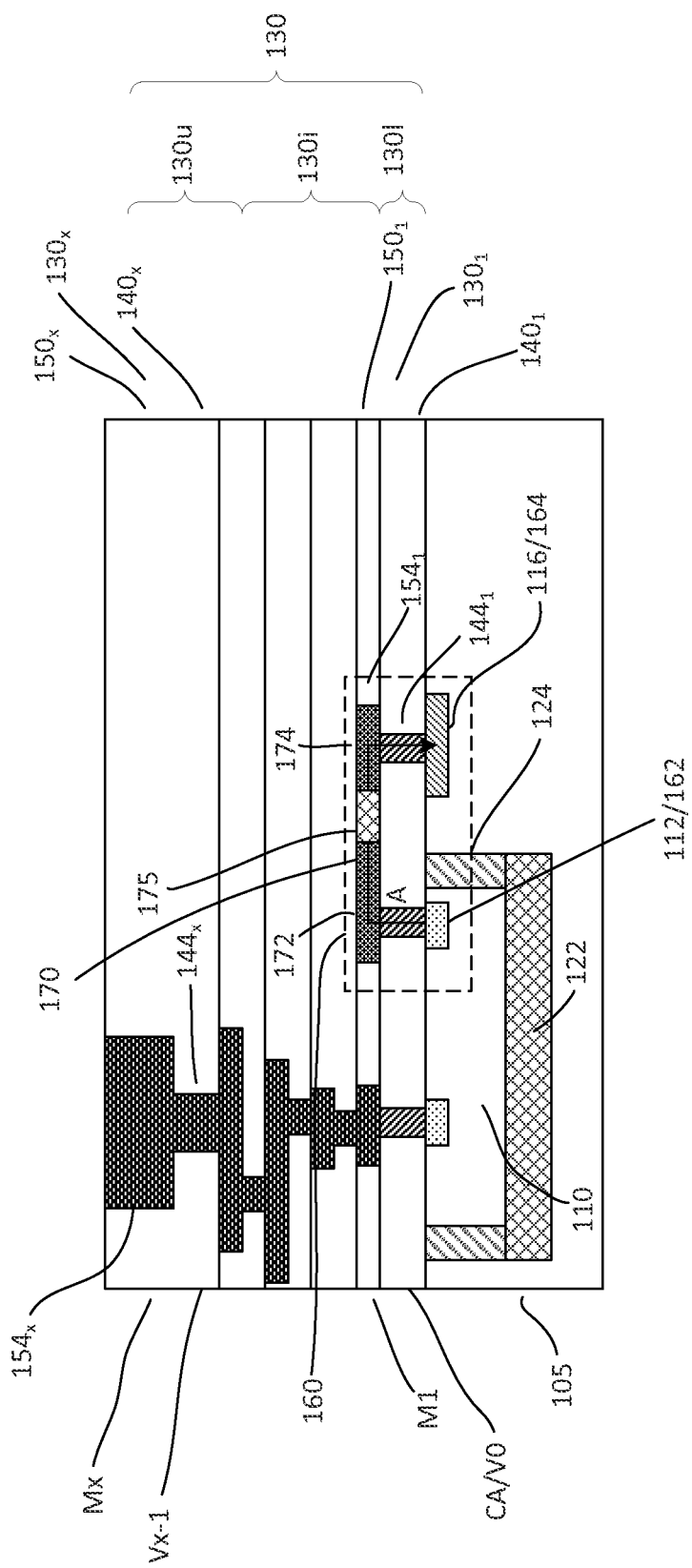
FIGS. 1a-1b show cross-sectional views of an embodiment of a device.
Figure 1B:
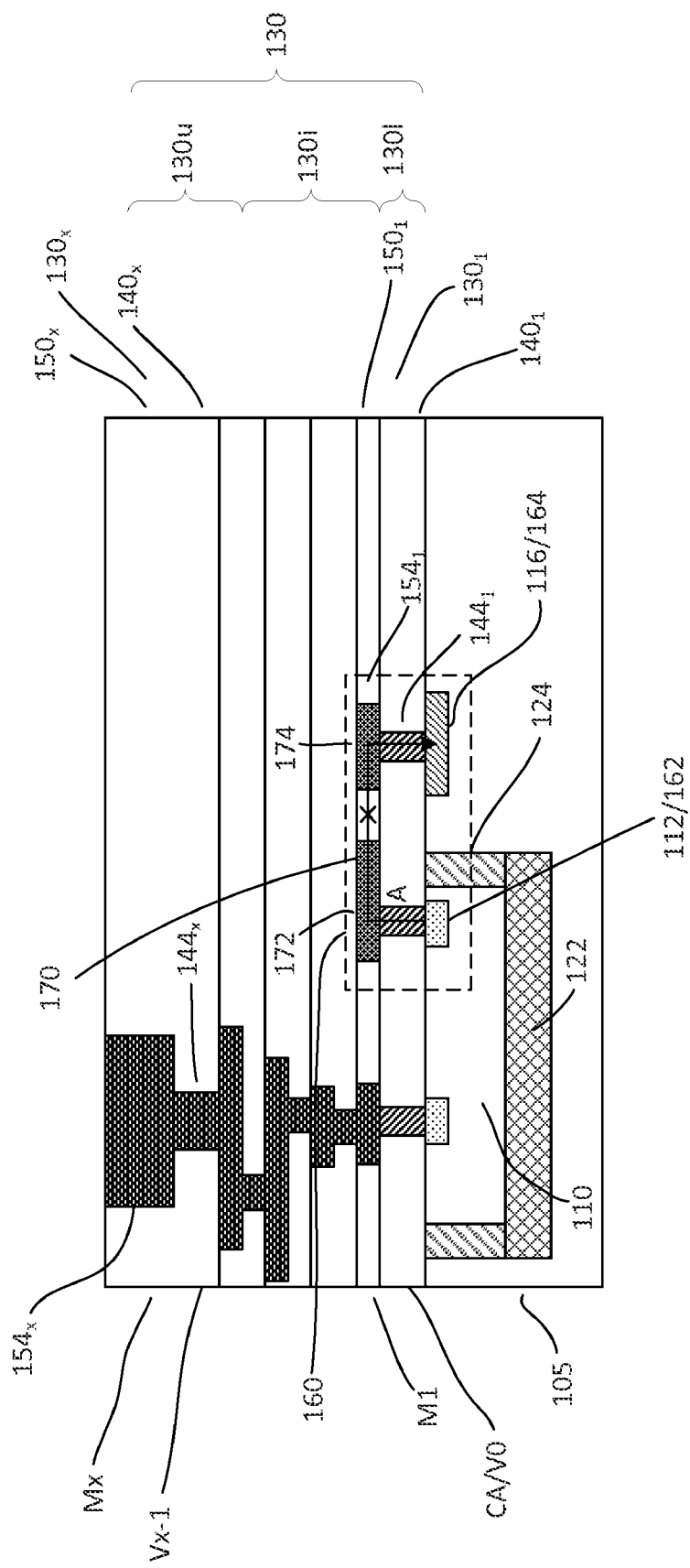

FIGS. 1a-1b show an embodiment of a device 100. The device, for example, is an IC. Other types of devices may also be useful. The device includes a substrate 105. The substrate, for example, is a semiconductor substrate, such as a silicon substrate or wafer. In one embodiment, the substrate is a lightly doped p-type substrate. Other types of semiconductor substrates, including crystalline-on-insulator (COI) substrates, such as silicon-on-insulator (SOI) substrates, may also be useful.

The substrate may include various types of regions. Such regions, for example, may include high voltage (HV), memory and logic regions. High voltage devices are formed in the HV regions, logic devices are formed in the logic regions while memory devices are formed in the memory or array regions. The devices, for example, are metal oxide semiconductor (MOS) transistors. Other suitable types of devices or device regions may also be useful.

Front-end-of-line (FEOL) processing is performed on the substrate. For example, isolation regions are formed to isolate different device regions. The isolation regions, for example, are shallow trench isolation (STI) regions. Other types of isolation regions may also be useful. For example, the isolation regions may be doped isolation regions. The isolation regions are provided to isolate device regions from other regions. Device wells are formed for p-type and n-type transistors for a complementary MOS (CMOS) device. Separate implants may be employed to form different doped wells using, for example, implant masks, such as photoresist masks. Gates of transistors are formed on the substrate. The gates are formed by, for example, forming a gate oxide layer, such as thermal silicon oxide followed by a gate electrode layer, such as polysilicon. The gate electrode may be doped. Other suitable types of gate materials may also be useful. Separate processes may be performed for forming gate dielectrics of the different voltage transistors. This is due to, for example, different gate oxide thicknesses associated with the different voltage transistors. For example, a HV transistor will have a thicker gate dielectric than a low voltage (LV) transistor.

After the gate layers are formed, they are patterned to form gates. For example, a photoresist mask may be used for a RIF to pattern the gate layers to form the gates. Source/drain (S/D) are formed adjacent to the gates. The S/D regions are heavily doped regions. Depending on the type of device, the S/D regions may be heavily doped n-type or p-type regions. For n-type transistors, the S/D regions are heavily doped n-type regions and for p-type transistors, the S/D regions are heavily doped p-type regions. Lightly doped diffusion regions may be provided for the S/D regions. Dielectric sidewall spacers may be provided on sidewalk of the gates to facilitate formation of the lightly doped diffusion regions. Separate implants may be employed to form different doped regions using, for example, implant masks, such as photoresist masks.

In one embodiment, the substrate includes a HV device region. The HV device region serves as a HV region for first polarity type devices. For example, the device region includes a HV device well 110 with second polarity type dopants for first polarity type HV device. Other types of device regions may also be useful. In one embodiment, the first polarity type is n-type and the second polarity type is p-type. The implant dose for the device well may be about $1E12$~$1E13/cm^2$. Other suitable implant dose may also be useful. The implant dose, for example, may depend on the technology node or application.

The device well, in one embodiment, is isolated from the substrate. For example, the device well is an isolated device well. The device well is isolated from the substrate by doped isolation wells 122 and 124. The isolation wells surround the device well. In one embodiment, side isolation wells 124 surrounding the device welt are provided and a bottom isolation well 122 is disposed below the device well. The isolation wells encompass the device welt, isolating it from the substrate. In one embodiment, the isolation wells include first polarity type dopants. For example, the isolation wells include n-type dopants for isolating a p-type device well. The implant dose for the isolation wells, for example, may be about $1E12$~$1E13/cm^2$. Other suitable implant dose may also be useful.

Contact regions ma be provided. The contact regions provide contact to different parts of a substrate. The contact regions are heavily doped regions. The implant dose for the contact regions may be about $1E15/cm^2$. Other suitable implant dose for the contact regions may also be useful.

Some contact regions may be doped with first polarity type dopants while others are doped with second polarity type dopants. The first polarity type contact regions may be formed by selective ion implantation of first polarity type dopants using an implant mask, such as a photoresist mask. The second polarity type contact regions may be formed by selective ion implantation of second polarity type dopants using an implant mask.

In one embodiment, device well contacts 112 are provided in the device well. The device well contacts include second polarity type dopants. In one embodiment, a first substrate contact 116 is provided in the substrate outside of the device well. The first substrate contact includes first polarity type dopants. The substrate 105 may also be provided with second substrate contacts (not shown) with second polarity type dopants. The first substrate contact 116, as shown, is disposed in the substrate near the device well. Substrate contacts may be provided for the side isolation wells. For example, first polarity type substrate contacts may be provided to bias the side isolation wells.

First polarity type device or devices (not shown) are formed in the device region. The first polarity type devices may include HV first polarity type devices, such as first polarity type HV transistors. In one embodiment, the high voltage first polarity type devices are first polarity type non-volatile memory (NVM) devices. For example, the device region is an array region for a NVM memory array having a plurality of NVM cells interconnected by wordlines and bitlines. Other types of first polarity type devices may also be useful.

Back-end-of-line (BEOL) processing is performed after completion of FEOL processing. The BEOL process includes forming interconnects in ILD layers 130. The interconnects connect the various components of the IC to perform the desired functions. An ILD layer includes a metal level 150 and a contact level 140. Generally, the metal level includes conductors or metal lines 154 while the contact level includes contacts 144. The conductors and contacts may be formed of a metal, such as copper, copper alloy, aluminum, tungsten or a combination thereof. Other suitable types of metals, alloys or conductive materials may also be useful. In some cases, the conductors and contacts may be formed of the same material. For example, in upper metal levels, the conductors and contacts may be formed by dual damascene processes. This results in the conductors and contacts having the same material. In some cases, the conductors and contacts may have different materials. For example, in the case where the contacts and conductors are formed by single damascene processes, the materials of the conductors and contacts may be different. Other suitable techniques, such as but not limited to RIE, may also be employed to form metal lines.

A device may include a plurality of ILD layers or levels. For example, x number of ILD levels may be provided. As shown, the device includes 5 ILD levels (x=5). Other number of ILD levels may also be useful. The number of ILD levels may depend on, for example, design requirements or the logic process involved. The ILD layers may include lower or bottom ILD layer $130_1$, an upper or top ILD layer $130u$ and one or more intermediate ILD layers $130i$ between the lower and upper ILD layers. A metal level of an ILD level may be referred to as $M_i$, where i is the $i^{th}$ ILD level of x ILD levels. A contact level of an ILD level may be referred to as $V_{i-1}$, where i is the $i^{th}$ ILD level of x ILD levels. For the first contact level of the lower ILD level, it may be referred to as CA.

The BEOL process, for example, commences by forming a dielectric layer over the transistors and other components formed in the FEOL process. The dielectric layer may be silicon oxide. For example, the dielectric layer may be silicon oxide formed by chemical vapor deposition (CVD). The dielectric layer serves as a premetal dielectric (PAD) layer or CA layer of the BEOL process. Contacts are formed in the CA level dielectric layer. The contacts, in one embodiment, are formed by a single damascene process. The single damascene process includes forming via openings in the dielectric layer using mask and etch techniques. For example, a patterned resist mask with openings corresponding to the vias is formed over the dielectric layer. An anisotropic etch, such as a RIE, is performed to form the vias, exposing the contact regions below, such as S/D regions and gates. A conductive layer, such as tungsten is deposited on the substrate, filling the openings. The conductive layer may be formed by sputtering. Other suitable techniques may also be useful. A planarization process, such as chemical mechanical polishing (CMP), is performed to remove excess conductive material, leaving contact plugs in the CA level.

After forming contacts in the CA level, the BEOL process continues to form dielectric layers over the substrate, covering the CA level dielectric layer. The dielectric layer, for example, serves as a first metal level M1 of the first ILD layer. The dielectric layer, for example, is a silicon oxide layer. Other suitable types of dielectric layers may also be useful. The dielectric layer may be formed by CVD. Other suitable techniques for forming the dielectric layer may also be useful.

Conductive lines are formed in the M1 level dielectric layer. The conductive lines may be formed by a damascene technique. For example, the dielectric layer may be etched to form trenches or openings using, for example, mask and etch techniques. A conductive layer is formed on the substrate, filling the openings. For example, a copper or copper alloy layer may be formed to fill the openings. The conductive material may be formed by, for example, plating, such as electrochemical or electroless plating. Other suitable types of conductive layers or forming techniques may also be useful. The first metal level M1 and first contact level CA serve as the lower ILD level 1301. Other techniques for forming interconnects for M1 may also be useful. For example, RIE techniques may be used to form interconnects for M1.

The process continues to form additional ILD layers. For example, the process continues to form intermediate and top ILD layers. As shown, the intermediate layers include the second to the fifth ILD layers or levels. The additional ILD layers may be formed of silicon oxide. Other suitable types of dielectric materials, such as low k, high k or a combination of dielectric materials may also be useful. The ILD layers may be formed by, for example, CVD. Other suitable techniques for forming the ILD layers may also be useful.

The conductors and contacts of the additional ILD layers may be formed by dual damascene techniques. For example, vias and trenches are formed, creating dual damascene structures. The dual damascene structure may be formed by, for example, via first or via last dual damascene techniques. Mask and etch techniques may be employed to form the dual damascene structures. The dual damascene structures are filled with a conductive layer, such as but not limited to copper or copper alloy. The conductive layer may be formed by, for example, plating techniques. Excess conductive material is removed, forming conductors and contacts in the intermediate ILD layers. Other techniques may be employed to for the additional ILD layers. Such techniques may include single damascene, RIE or a combination thereof.

The upper ILD layers may have different design rules, such as critical dimension (CD), than the lower ILD layers. For example, the upper ILD layer may have a larger CD than the lower ILD layers. For example, the top ILD layer may have a CD which is 2× or 6× the CD of the lower or intermediate ILD layers. Other configurations or design rules for the ILD layers may also be useful.

A dielectric liner (not shown) may be disposed between ILD levels and on the substrate. The dielectric liner, for example, serves as an etch stop layer. The dielectric liner may be formed of a low k dielectric. For example, the dielectric liner may be nBLOK. Other suitable types of dielectric materials for the dielectric liner may also be useful.

A pad level or pad dielectric layer (not shown) may be disposed over the top ILD level. A protection layer may be provided between the top ILD level and the pad level. The protection layer is a dielectric layer. The pad level may include pad contacts connected to interconnects of the ILD layers. The pad contacts serve as external connections to the device. The pad contacts, for example, may be aluminum (Al) pad contacts. Other suitable conductive materials, such as but not limited to Cu, may also be used to serve as the pad interconnect.

The device includes a charge discharger 160. The discharger provides a discharge path for charge, such as plasma charge, collected in the device well to the substrate. The plasma charge may collect in the device well due to etching, such as a RIE, to form single or dual damascene structures for interconnects. The discharge path is illustrated by arrow A as shown in FIG. 1a. The discharge path should be sufficient to discharge all the plasma charges from the device well to the substrate. In one embodiment, the discharge path of the discharger is a temporary discharge path. For example, the discharge path exists or is functional during processing. After processing, such as BEOL processing, is completed, the discharge path is destroyed to become non-functional.

In one embodiment, the discharger includes a diode with a fuse unit 170. The diode includes a first diode terminal 162 and a second diode terminal 164. In one embodiment, the first diode terminal includes a device well contact 112 and the second diode terminal includes a first substrate contact 116. For example, the first diode terminal is a p-type diode terminal and the second diode terminal is an n-type diode terminal. Providing more than one well and substrate contacts to serve as diode terminals may also be useful. The diode is configured to discharge plasma charges from the device well to the substrate.

As for the fuse unit, it is coupled to the first and second diode terminals. The fuse unit includes a fuse section 175 disposed between first and second fuse terminals 172 and 174. The fuse unit is formed of a conductive material. In one embodiment, the fuse unit is disposed in a metal level. For example, the fuse unit may be formed of the same material as interconnects of the metal level. In one embodiment, the fuse unit is formed of copper or copper alloy. Other types of conductive materials for the fuse unit may also be useful. In one embodiment the fuse unit is disposed in the first metal level. For example, the fuse unit is disposed on the lowest metal level of the device. Providing the fuse unit in other metal levels may also be useful. For example, the fuse unit may be disposed in any metal level which is below an ILD level which incurs plasma damage during processing.

As described, the fuse unit includes a fuse section 175 disposed between first and second fuse terminals 172 and 174. The fuse section includes an electronic fuse connecting the first and second fuse terminals. The fuse section, in some embodiments, includes a fuse array having a plurality of fuses connecting the first and second fuse terminals. The fuse is designed to be capable of being blown using a current (fuse current). The magnitude of the fuse current should be below a damage threshold value which would negatively impact reliability of interconnects in the device. Providing the fuse array may facilitate designing a sufficiently large discharge path for dissipating all plasma charges from the device well to the substrate while maintaining the fuse current below the damage threshold value.

The first fuse terminal 172 is coupled to the first diode terminal 162. The second fuse terminal 174 is coupled to the second diode terminal 164. Coupling the fuse terminals to the diode terminals is achieved using via contacts. For example, via contacts in the CA level couple the fuse terminals in the first metal level to the diode terminals. In the case where the fuse unit is disposed on other metal levels, via contacts and conductors or interconnect pads may be used to connect the fuse terminals to the diode terminals. Interconnect pads, for example, are metal islands in the metal level.

The fuse unit includes connections to first and second test pads (not shown). The test pads, for example, are disposed on the pad level of the device. Connections between the test pads and fuse unit may be provided by via contacts in the via levels and interconnect pads (not shown) in interconnect or metal levels (no shown). The test pads provide external connections to the fuse unit. In one embodiment, the first test pad is electrically connected to the first fuse terminal and the second test pad is electrically connected to the second fuse terminal. The first fuse terminal may include a first contact pad for interconnecting to the first test pad and the second fuse terminal may include a second contact pad for interconnecting to the second test pad. The contact pads, for example, are disposed in the same metal level as the fuse terminals. The test pads enable a current to be provided to the fuse unit to blow the fuse or fuses, destroying the temporary discharge path.

During processing, such as BEOL processing, the temporary discharge path exists to discharge the plasma charges stored in the device well from, for example, RIE. After BEOL processing is completed, the electronic fuse of the fuse unit is blown or destroyed, as shown in FIG. 1b. For example, a fuse current is passed through the fuse unit via the test pads to blow the fuse or fuses. By destroying the discharge path, the device can operate as normally after test and packaging.

Other suitable types of dischargers may also be useful. For example, a discharger may be an electronic switch which switches on the discharge path during BEOL processing and switches off the discharge path after completion of the BEOL processing. The electronic switch may include poly fuse or middle of line metal fuse.

In one embodiment, after the BEOL processing is completed, the discharge path from the floating device well to the substrate is rendered non-functional. For example, the fuses in the discharge path are blown, disconnecting the floating device well 110 from the substrate. In other embodiments, the electronic switch switches off the connection between the floating device well and the substrate, rendering the discharge path non-functional. The device undergoes an electrical die sorting (EDS) test after the IC fabrication process is completed. For example, after rendering the discharge path non-functional, the device is sorted. The functional chips are then packaged and undergo basic package testing.

FIG. 2 shows an embodiment of a NVM memory cell 200. The NVM memory cell is disposed in, for example, the isolated device well 110 on the substrate 105. As shown, the memory cell includes a gate 225 disposed between first and second S/D regions $229_1$-$229_2$. The gate, for example, includes a control gate 227 disposed over a floating gate 228. The control gate is separated from the floating gate by a floating dielectric and the floating gate is separated from the substrate by a gate dielectric. The S/D regions are heavily doped regions with first polarity type dopants. For example, the S/D regions are heavily doped with n-type dopants for an n-type NVM cell. The first S/D region serves as a drain while the second S/D region serves as a source. The control gate is coupled to a wordline, the first S/D region is coupled to a bitline and the source is coupled to a source line or ground. Other suitable configurations or types of NVM cells may also be useful. A plurality of NVM cells are coupled by wordlines, bitlines and source lines to form a NVM array.

Figure 3:
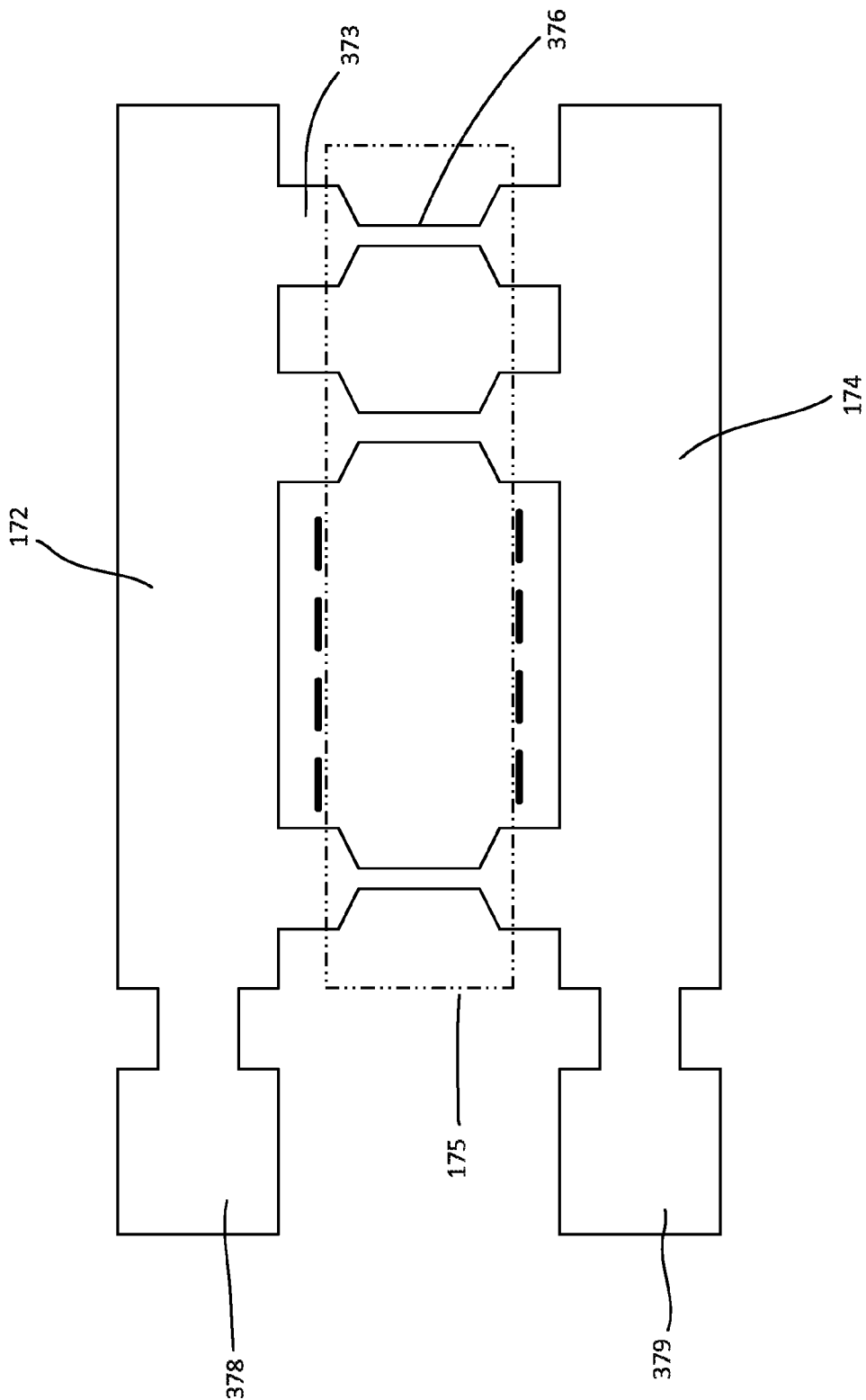
FIG. 3 shows a top view of an exemplary embodiment of a fuse.

FIG. 3 shows an exemplary top view of a fuse unit 170. The fuse unit may be disposed in a first metal level of a device. Providing the fuse unit in other metal levels may also be useful. As shown, the fuse unit includes first and second fuse terminals 172 and 174. The fuse terminals may be elongated members disposed on opposite sides of a fuse section 175. The fuse terminals may include fuse feeds 373. The fuse feeds are protrusions which extend from the fuse terminals and are coupled to fuses 376 of the fuse section. As shown, the fuse section includes a fuse array with a plurality of fuses. Providing a fuse section which one fuse may also be useful. The number of fuses may depend on design requirements.

A first contact pad 378 may be provided at an end of the first fuse terminal and a second contact pad 379 may be provided at an end of the second fuse terminal. As shown, the contact pads are disposed on first or same ends of the fuse terminals. Providing contact pads at different ends of the fuse terminals or other locations may also be useful. The contact pads are used to connect the fuse terminals to the test pads. The fuse unit, for example, may be formed by mask and etch techniques. For example, the pattern of the fuse unit may be incorporated into a reticle of a metal layer to pattern a metal layer to form interconnects as well as the fuse unit.

The present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A device comprising:
   a semiconductor substrate;
   a plurality of interlevel dielectric (ILD) layers disposed on the substrate, wherein each of the ILD layers comprises a metal level and a contact level;
   a device region in the substrate, the device region comprises a second polarity type floating well, the floating well is isolated from the substrate by a well isolation region surrounding the floating well;
   a first polarity type device disposed in the device region;

a discharge region in the substrate comprising first polarity type dopants, the discharge region is isolated from the floating well by the well isolation region; and a discharger comprising a fuse unit, wherein the fuse unit is disposed in one of the metal levels of the ILD layers, the fuse unit comprises a fuse array having a plurality of fuses, wherein the plurality of fuses of the fuse unit are horizontally aligned in the same metal level, the discharger comprises a temporary discharge path from the floating well to the discharge region, wherein the temporary discharge path is configured to discharge plasma charge from the floating well to the discharge region of the substrate during back-end-of-line (BEOL) processing, the temporary discharge path is configured to enable the first polarity type device to function after completion of the BEOL processing by blowing the plurality of fuses of the fuse unit with a fuse current, and the plurality of fuses of the fuse unit provides a large discharge path sufficient to dissipate all plasma charges from the floating well to the discharge region of the substrate while maintaining the fuse current below a damage threshold value which negatively impacts interconnect reliability.

2. The device of claim 1 wherein the first polarity type comprises n-type and the second polarity type comprises p-type.

3. The device of claim 1 wherein:
the first polarity type comprises n-type;
the second polarity type comprises p-type;
wherein the first polarity type device comprises a non-volatile memory device.

4. The device of claim 1 wherein the discharger comprises:
a diode having first and second diode terminals, wherein
the first diode terminal comprises a first polarity type doped region disposed in the discharge region, and
the second diode terminal comprises a second polarity type doped region disposed in the floating well;
the fuse unit, wherein the fuse unit comprises
a first fuse terminal,
a second fuse terminal, and
at least one fuse of the fuse array connecting the first and second fuse terminals;
a first fuse unit connector connecting the first fuse terminal and the first diode terminal; and
a second fuse unit connector connecting the second fuse terminal and the second diode terminal.

5. The device of claim 4 wherein the plurality of fuses of the fuse array connects the first and second fuse terminals.

6. The device of claim 4 wherein:
the contact level of each of the ILD layer comprises contacts, and
the metal level of each of the ILD layer comprises metal interconnects; and
the fuse unit is disposed in a fuse metal level which is the metal level of one of the ILD layers.

7. The device of claim 6 wherein the fuse metal level is below an ILD layer of the plurality of ILD layers which incurs plasma damage during the BEOL processing.

8. The device of claim 6 wherein the fuse metal level is a first metal level of a first ILD layer of the plurality of the ILD layers, wherein the first ILD layer is in the closest proximity to the substrate relative to the remainder of the plurality of ILD layers.

9. The device of claim 8 wherein:
the first fuse unit connector comprises a first contact disposed in a first contact level disposed below the first metal level and over the substrate, the first contact connecting the first fuse terminal to the first diode terminal; and
the second fuse unit connector comprises a second contact disposed in the first contact level, the second contact connecting the second fuse terminal to the second diode terminal.

10. The device of claim 4 comprises:
a first test pad coupled to the first fuse terminal;
a second test pad coupled to the second fuse terminal; and
wherein the first and second test pads enable a current to flow through the plurality of fuses of the fuse unit to blow the fuses after completion of the BEOL processing to render the discharger non-functional.

11. The device of claim 1 wherein the well isolation region comprises a first polarity type isolation well surrounding sides and bottom of a second polarity type well to form the second polarity type floating well.

12. A method of forming a device comprising:
providing a semiconductor substrate;
forming a second polarity type floating well in a device region in the substrate, the floating well is isolated from the substrate by a well isolation region surrounding the floating well;
forming a first polarity type doped region in a discharge region of the substrate outside of the floating well, the first polarity type doped region serves as a first diode terminal;
forming a second polarity type doped region in the floating well, the second polarity type doped region serves as a second diode terminal;
completing front-end-of-line (FEOL) processing, including forming a first polarity type device in the device region;
commencing back-end-of-line (BEOL) processing which includes forming a plurality of interlevel dielectric (ILD) levels on the substrate, wherein each of the ILD levels includes a via level with via contacts and a metal level with metal interconnects, and wherein the via level is disposed below the metal level; and
forming a fuse unit having a fuse array in a fuse metal level which is one of the metal levels of the plurality of ILD levels, the fuse array having a plurality of fuses, the plurality of fuses of the fuse unit are horizontally aligned in the same fuse metal level, wherein the fuse unit comprises
a first fuse terminal connected to the first diode terminal,
a second fuse terminal connected to the second diode terminal,
at least one fuse of the fuse array connecting the first and second fuse terminals, and
wherein the fuse unit and diode form a discharger with a temporary discharge path from the floating well to the discharge region,
the temporary discharge path is configured to discharge plasma charge from the floating well to the discharge region of the substrate during the BEOL processing,
the temporary discharge path is configured to enable the first polarity type device to function after completion of the BEOL processing by blowing the plurality of fuses of the fuse unit with a fuse current, and the plurality of fuses of the fuse unit provides a large discharge path sufficient to dissipating all plasma charges from the floating well to the discharge region of the substrate while maintaining the fuse current below a damage threshold value which negatively impacts interconnect reliability.

13. The method of claim 12 wherein the plurality of fuses of the fuse array connects the first and second fuse terminals.

14. The method of claim 12 wherein the fuse metal level is in a metal level below a metal level which incurs plasma damage during processing.

15. The method of claim 12 wherein the fuse metal level is disposed in a first metal level of a first ILD layer of the plurality of the ILD layers, wherein the first ILD layer is in the closest proximity to the substrate relative to the remainder of the plurality of ILD layers.

16. The method of claim 15 wherein the BEOL processing comprises:
  forming a first dielectric layer of a first contact level over the substrate;
  forming first and second contacts in the first contact level, the first contacts are in communication with the first diode terminal and the second contacts are in communication with the second diode terminal;
  forming a second dielectric layer over the first dielectric layer, the second dielectric layer serves as the first metal level and the fuse metal level; and
  forming the first and second fuse terminals connected by at least one fuse in the second dielectric layer, the first fuse terminal is in communication with the first contacts and the second fuse terminal is in communication with the second contacts.

17. The method of claim 16 wherein the BEOL processing comprises:
  forming a first test pad in a pad level, the first test pad is in communication with the first fuse terminal;
  forming a second test pad in the pad level, the second test pad is in communication with the second fuse terminal; and
  wherein the first and second test pads enable a current to flow through the fuses of the fuse unit for blowing the fuses.

18. The method of claim 17 comprises blowing the fuses of the fuse unit after completion of the BEOL processing to render the discharger non-functional.

19. A device comprising:
  a semiconductor substrate;
  a plurality of interlevel dielectric (ILD) layers disposed on the substrate, wherein each of the ILD levels comprises a metal level and a contact level;
  a device region in the substrate, the device region comprises a p-type floating well, the floating well is isolated from the substrate by a well isolation region surrounding the floating well;
  a n-type device disposed in the device region;
  a discharge region in the substrate comprising n-type dopants; and
  a discharger comprising a fuse unit, wherein the fuse unit is disposed in one of the metal levels of the ILD layers, the fuse unit comprises a fuse array having a plurality of fuses, wherein the plurality of fuses of the fuse unit are horizontally aligned in the same metal level, the discharger comprises a temporary discharge path from the device region to the discharge region, wherein
    the temporary discharge path is configured to discharge plasma charge from the floating well to the discharge region of the substrate during back-end-of-line (BEOL) processing,
    the temporary discharge path is configured to enable the n-type device to function after completion of the BEOL processing by blowing the plurality of fuses of the fuse unit with a fuse current, and
    the plurality of fuses of the fuse unit provides a large discharge path sufficient to dissipating all plasma charges from the floating well to the discharge region of the substrate while maintaining the fuse current below a damage threshold value which negatively impacts interconnect reliability.

20. The device of claim 19 wherein the discharger comprises:
  a diode having first and second diode terminals, wherein the first diode terminal comprises a first polarity type doped region disposed in the discharge region, and the second diode terminal comprises a second polarity type doped region disposed in the floating well;
  the fuse unit, wherein the fuse unit comprises
    a first fuse terminal,
    a second fuse terminal, and
    at least one fuse of the fuse array connecting the first and second fuse terminals;
  a first fuse unit connector connecting the first fuse terminal and the first diode terminal; and
  a second fuse unit connector connecting the second fuse terminal and the second diode terminal.

* * * * *